United States Patent
Ye

(10) Patent No.: US 10,446,691 B2
(45) Date of Patent: Oct. 15, 2019

(54) SEMICONDUCTOR STRUCTURE AND METHODS FOR CRYSTALLIZING METAL OXIDE SEMICONDUCTOR LAYER

(71) Applicant: AU OPTRONICS CORPORATION, Hsin-chu (TW)

(72) Inventor: Jia-Hong Ye, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/635,989

(22) Filed: Jun. 28, 2017

(65) Prior Publication Data
US 2018/0006157 A1   Jan. 4, 2018

(30) Foreign Application Priority Data
Jun. 29, 2016   (TW) .............................. 105120590 A

(51) Int. Cl.
*H01L 29/786*   (2006.01)
*H01L 21/02*   (2006.01)
(Continued)

(52) U.S. Cl.
CPC .... *H01L 29/7869* (2013.01); *H01L 21/02178* (2013.01); *H01L 21/02244* (2013.01);
(Continued)

(58) Field of Classification Search
CPC ................. H01L 29/7869; H01L 29/24; H01L 29/42356; H01L 29/66969;
(Continued)

(56) References Cited

U.S. PATENT DOCUMENTS 8,482,001 B2   7/2013   Yamazaki et al.
8,900,900 B2   12/2014   Chen et al.
(Continued)

FOREIGN PATENT DOCUMENTS

| CN | 101548388 A | 9/2009 |
| CN | 103700665 A | 4/2014 |
| TW | 201140809 A | 11/2011 |

OTHER PUBLICATIONS

Office Action issued by (TIPO) Intellectual Property Office, Ministry of Economic Affairs, R. 0. C. dated Dec. 23, 2016 for Application No. 105120590, Taiwan.
(Continued)

*Primary Examiner* — Tong-Ho Kim
(74) *Attorney, Agent, or Firm* — Tim Tingkang Xia, Esq.; Locke Lord LLP

(57) ABSTRACT

The present invention provides two methods for crystallizing a metal oxide semiconductor layer and a semiconductor structure. The first crystallization method is treating an amorphous metal oxide semiconductor layer including indium with oxygen at a pressure of about 550 mtorr to about 5000 mtorr and at a temperature of about 200° C. to about 750° C. The second crystallization method is, firstly, sequentially forming a first amorphous metal oxide semiconductor layer, an aluminum layer, and a second amorphous metal oxide semiconductor layer on a substrate, and, secondly, treating the first amorphous metal oxide semiconductor layer, the aluminum layer, and the second amorphous metal oxide semiconductor layer with an inert gas at a temperature of about 350° C. to about 650° C.

4 Claims, 11 Drawing Sheets

(51) Int. Cl.
  *H01L 29/24* (2006.01)
  *H01L 29/66* (2006.01)
  *H01L 29/423* (2006.01)
  *H01L 27/12* (2006.01)

(52) U.S. Cl.
  CPC .. *H01L 21/02422* (2013.01); *H01L 21/02425* (2013.01); *H01L 21/02488* (2013.01); *H01L 21/02565* (2013.01); *H01L 21/02667* (2013.01); *H01L 21/02672* (2013.01); *H01L 27/1225* (2013.01); *H01L 27/1255* (2013.01); *H01L 29/24* (2013.01); *H01L 29/42356* (2013.01); *H01L 29/66969* (2013.01); *H01L 29/78696* (2013.01); *H01L 21/02592* (2013.01)

(58) Field of Classification Search
  CPC ......... H01L 29/78696; H01L 21/02178; H01L 21/02244; H01L 21/02488; H01L 21/02565; H01L 21/02592; H01L 21/02672; H01L 21/02425; H01L 21/02677; H01L 27/1225; H01L 27/1255
  USPC .......................................................... 257/43
  See application file for complete search history.

(56) References Cited

U.S. PATENT DOCUMENTS

| | | |
|---|---|---|
| 2009/0269880 A1 | 10/2009 | Itagaki et al. |
| 2010/0127256 A1* | 5/2010 | Inoue ..................... C01G 9/02 257/43 |
| 2010/0140609 A1* | 6/2010 | Yano .................. H01L 29/7869 257/43 |
| 2012/0064664 A1 | 3/2012 | Yamazaki et al. |
| 2012/0268979 A1* | 10/2012 | Sekine ................. G11C 11/412 365/72 |
| 2013/0037795 A1 | 2/2013 | Sunamura et al. |
| 2013/0256666 A1 | 10/2013 | Chang et al. |
| 2013/0280859 A1 | 10/2013 | Kim et al. |
| 2015/0053973 A1 | 2/2015 | Yamazaki et al. |
| 2016/0336349 A1 | 11/2016 | Wang et al. |

OTHER PUBLICATIONS

Office Action issued by State Intellectual Property Office of the Peoples Republic of China dated Jul. 23, 2018 for Application No. 201610723919.2.

* cited by examiner

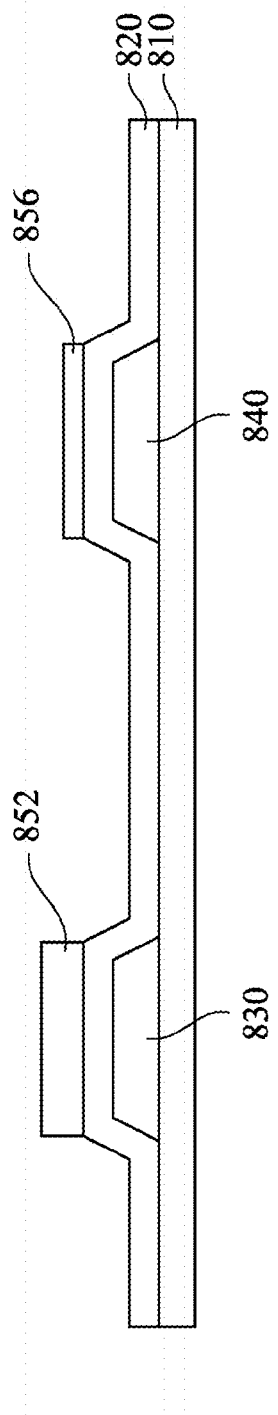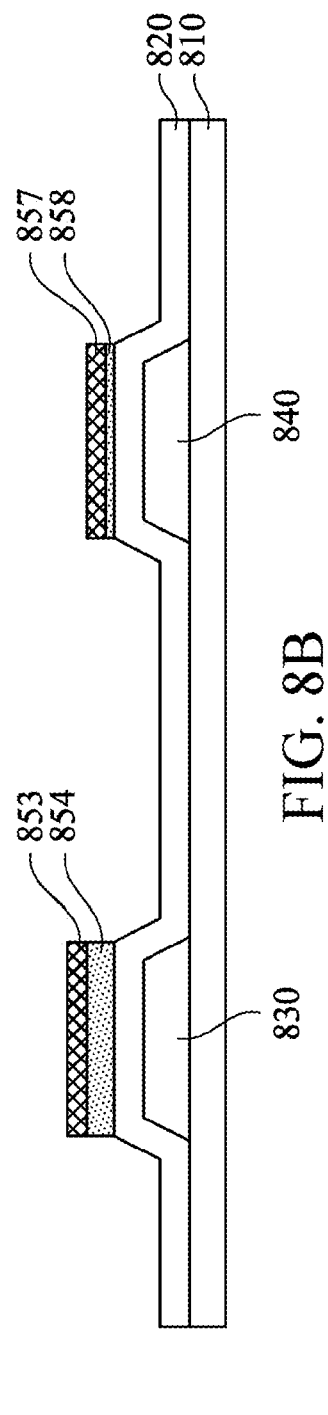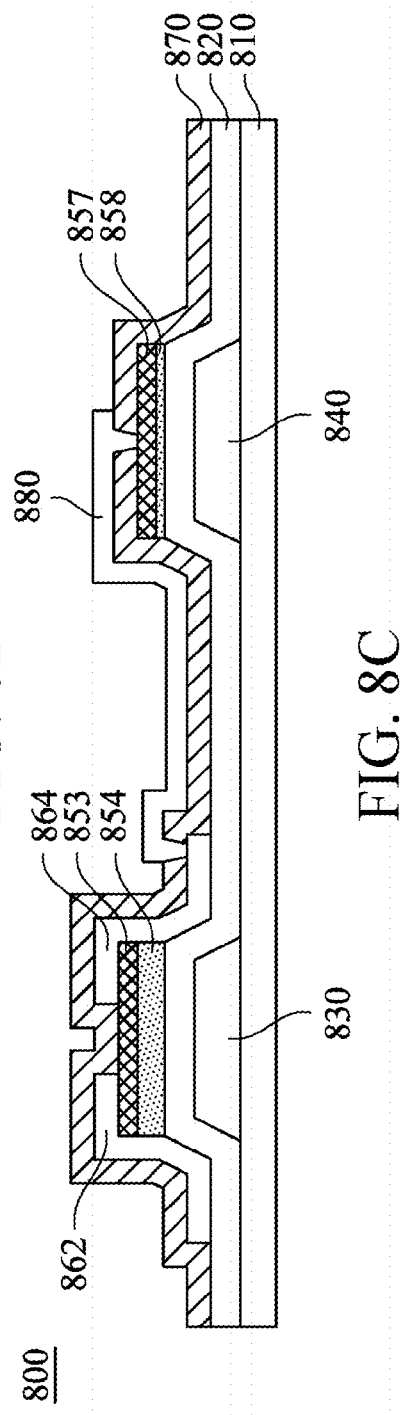

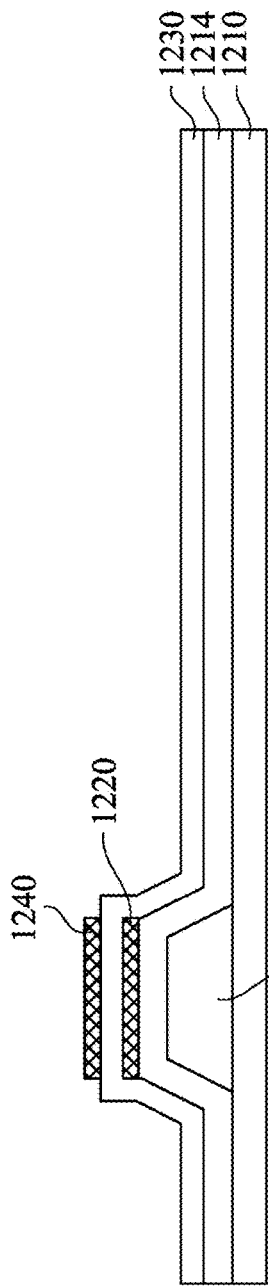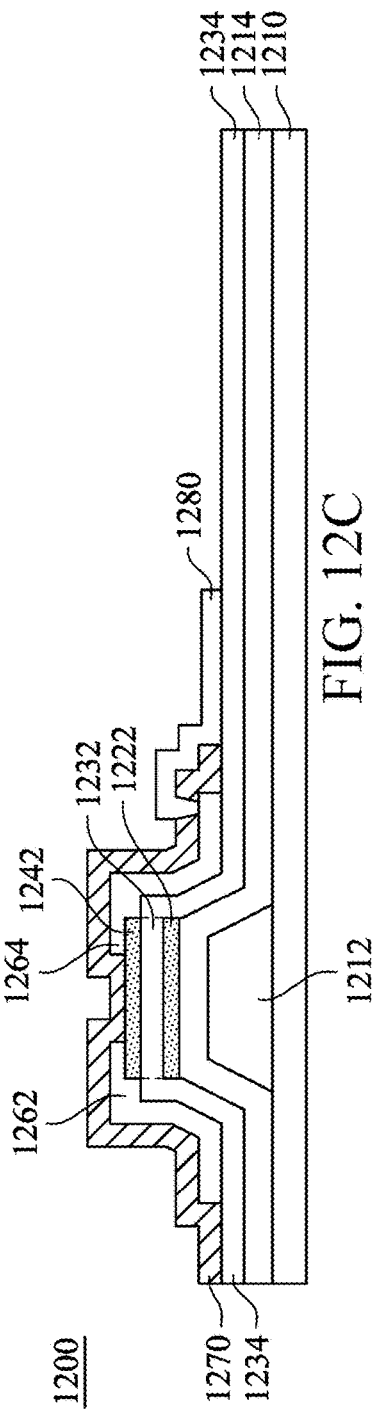

SEMICONDUCTOR STRUCTURE AND METHODS FOR CRYSTALLIZING METAL OXIDE SEMICONDUCTOR LAYER

CROSS-REFERENCE TO RELATED PATENT APPLICATION

This application claims the benefit of priority to Taiwan Patent Application No. 105120590, filed Jun. 29, 2016. The entire content of the above identified application is incorporated herein by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD

The present invention relates to a semiconductor structure and methods for crystallizing a metal oxide semiconductor layer, and more particularly to methods for making, by using oxygen or an inert gas, an amorphous metal oxide semiconductor layer form crystal, and a semiconductor structure formed by using this crystallization method.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In recent years, with the development of semiconductor manufacturing technologies, a manufacturing process of a thin-film transistor (TFT) also tends to be simple and fast, so that a TFT is widely applied to computer chips, mobile phone chips, TFT liquid crystal displays (LCDs), and the like. A common method for fabricating a TFT is back channel etch (BCE), which includes the following steps: firstly, forming a metal layer to cover an active layer, and, secondly, patterning the metal layer to form a source and a drain, where the step of patterning may be performed by using wet etching or dry etching. However, when an etchant is used to remove the metal layer above the active layer, the active layer is highly susceptible to damages for the exposure to the etchant, resulting in a decrease in a yield of TFTs.

In view of this, a method for fabricating a TFT in which an active layer can resist corrosion of an etchant and a structure formed by using this method are needed.

SUMMARY

The present invention provides a method for crystallizing a metal oxide semiconductor layer, including the following steps: forming an amorphous metal oxide semiconductor layer on a substrate, the amorphous metal oxide semiconductor layer including indium; and treating the amorphous metal oxide semiconductor layer with oxygen at a pressure of about 550 mtorr to about 5000 mtorr and at a temperature of about 200° C. to about 750° C., and changing a part of the amorphous metal oxide semiconductor layer into an indium oxide crystallization layer.

The present invention provides a semiconductor structure, including a substrate, a gate, a gate insulation layer, a first metal oxide semiconductor layer, a first indium oxide crystallization layer, and a source and a drain. The gate is configured on the substrate, the gate insulation layer is located on the gate, the first metal oxide semiconductor layer is configured on the gate insulation layer, the first indium oxide crystallization layer is in contact with an outside surface of the first metal oxide semiconductor layer, and the source and the drain are configured on the first indium oxide crystallization layer.

The present invention provides a method for crystallizing a metal oxide semiconductor layer, including the following steps: forming a first amorphous metal oxide semiconductor layer on a substrate, forming an aluminum layer on the first amorphous metal oxide semiconductor layer, forming a second amorphous metal oxide semiconductor layer on the aluminum layer, and treating the first amorphous metal oxide semiconductor layer, the aluminum layer, and the second amorphous metal oxide semiconductor layer with an inert gas at a temperature of about 350° C. to about 650° C.

The present invention provides a semiconductor structure, including a substrate, a gate, a gate insulation layer, a first crystallized metal oxide semiconductor layer, an aluminum oxide layer, a second crystallized metal oxide semiconductor layer, and a source and a drain. The gate is configured on the substrate, the gate insulation layer is located on the gate, the first crystallized metal oxide semiconductor layer is configured on the gate insulation layer, the aluminum oxide layer is located on the first crystallized metal oxide semiconductor layer, the second crystallized metal oxide semiconductor layer is configured on the aluminum oxide layer, and the source and the drain are configured on the second crystallized metal oxide semiconductor layer.

These and other features, aspects, and advantages of the present invention become more comprehensible with reference to the following description and the appended claims. It should be understood that the foregoing general description and the following specific description are merely exemplary and explanatory, and are intended to provide required further description of the present invention.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein:

FIG. 8A to FIG. 8C are schematic sectional views of a semiconductor structure in stages of a process according to an embodiment of the present invention;

FIG. 12A and FIG. 12C are schematic sectional views of a semiconductor structure in stages of a process according to an embodiment of the present invention.

DETAILED DESCRIPTION

Figure 1:
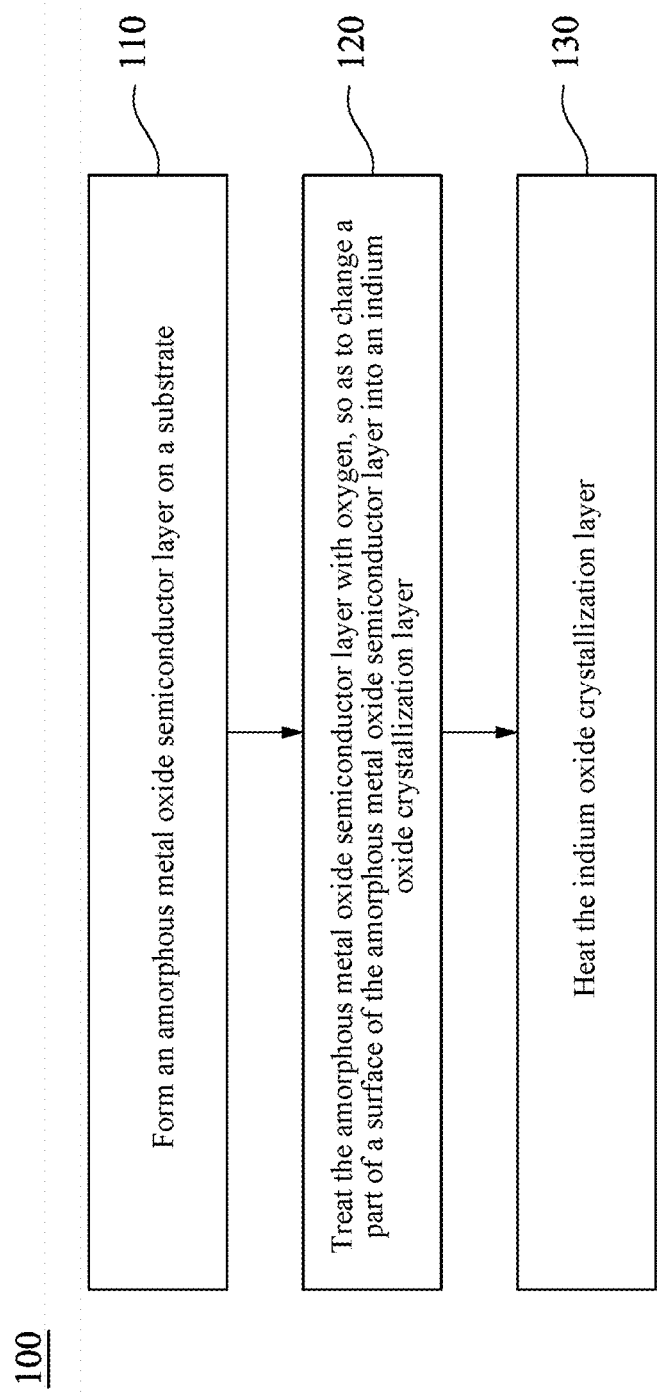
FIG. 1 shows a method for crystallizing a metal oxide semiconductor layer according to an embodiment of the present invention.

The objectives and advantages of the present invention will become more apparent by means of detailed description with the accompanying drawings and reference numerals in the following embodiments.

To make the description of the content of the present disclosure more specific and complete, reference may be made to the accompanying drawings and various embodiments in the following, where in the drawings, a same number represents same or similar elements, and for clear description, a size or thickness of an element may be exaggerated and is not drawn according to an original size. In addition, to simplify the drawings, some structures and elements are drawn in the drawings in a simple schematic manner. However, it should be understood that the provided embodiments are not used to limit the scope of the present invention. These details in practice should not be used to limit the present invention. That is, in some embodiments of the present invention, these details in practice are not essential.

Figure 2A:
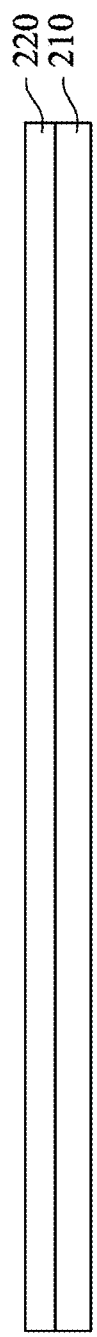
FIG. 2A and FIG. 2B are schematic sectional views of a semiconductor structure in stages of a process according to an embodiment of the present invention.
Figure 2B:
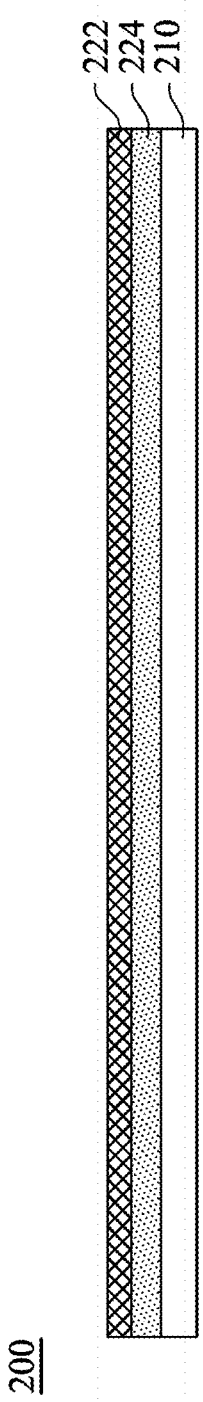

The present invention provides a method for crystallizing a metal oxide semiconductor layer. Referring to FIG. 1 and FIG. 2A and FIG. 2B. FIG. 1 shows a method 100 for crystallizing a metal oxide semiconductor layer according to an embodiment of the present invention. A crystallization method 100 includes an operation 110, an operation 120, and an operation 130. FIG. 2A and FIG. 2B are schematic sectional views of a semiconductor structure 200 in stages of a process according to an embodiment of the present invention. Although a series of operations or steps are used below to describe the method disclosed herein, an order of these operations or steps should not be construed as a limitation to the present invention. For example, some operations or steps may be performed in a different order and/or other steps may be performed at the same time. In addition, all shown operations, steps and/or features are not required to be executed to implement an embodiment of the present invention. In addition, each operation or step described herein may include a plurality of sub-steps or actions.

In the operation 110, as shown in FIG. 2A, an amorphous metal oxide semiconductor layer 220 is formed on a substrate 210, where the amorphous metal oxide semiconductor layer 220 includes indium. In an embodiment, the amorphous metal oxide semiconductor layer 220 includes indium gallium zinc oxide, indium tin zinc oxide, hafnium indium zinc oxide or indium zinc oxide.

In an embodiment, the amorphous metal oxide semiconductor layer 220 may be formed on the substrate 210 by using sputtering, spin coating, chemical vapor deposition (CVD), atomic layer deposition (ALD), low pressure CVD (LPCVD) or physical vapor deposition (PVD). The sputtering can be performed at a relatively low temperature and is applicable to substrates of various materials, and has relatively simple operations. In an embodiment, the substrate 210 is a glass substrate; however, a substrate of another material such as a plastic substrate and a metal substrate are also applicable.

In the operation 120, the amorphous metal oxide semiconductor layer 220 is treated with oxygen at a pressure of about 550 mtorr to about 5000 mtorr and at a temperature of about 200° C. to about 750° C., so as to change a part of a surface of the amorphous metal oxide semiconductor layer 220 into an indium oxide ($In_2O_3$) crystallization layer 222 shown in FIG. 2B, and form a metal oxide semiconductor layer 224.

Specifically, during the treatment, indium in a part of the amorphous metal oxide semiconductor layer 220 reacts with oxygen, to form an indium oxide crystallization layer 222. The indium oxide crystallization layer 222 is in contact with an outside surface of the metal oxide semiconductor layer 224, that is, an upper surface of the metal oxide semiconductor layer 224 shown in FIG. 2B. The amorphous metal oxide semiconductor layer 220 without indium forms the metal oxide semiconductor layer 224. More specifically, the metal oxide semiconductor layer 224 relatively close to the indium oxide crystallization layer 222 has indium content different from that of the amorphous metal oxide semiconductor layer 220, and this part may also be referred to as the metal oxide semiconductor layer 224 with changed indium content. Moreover, because a part of indium is removed, elements here may be rearranged to generate a metal oxide semiconductor in which proportions of a plurality of elements are different from those in the amorphous metal oxide semiconductor layer 220, where some metal oxide semiconductor crystals may be generated. In other words, because indium in a part of the amorphous metal oxide semiconductor layer reacts with oxygen, proportions of elements in the part of the amorphous metal oxide semiconductor layer are changed.

However, because of a relatively long distance from oxygen, the metal oxide semiconductor layer 224 away from the indium oxide crystallization layer 222 is relatively insusceptible to the treatment with oxygen, and comparatively, indium content, proportions of elements, and amorphous forms relatively closer to the original amorphous metal oxide semiconductor layer 220 are maintained. The metal oxide semiconductor layer 224 away from the indium oxide crystallization layer 222 is the part of the amorphous metal oxide semiconductor layer 220 that is relatively insusceptible to the treatment with oxygen. Therefore, the metal oxide semiconductor layer 224 includes a part in which proportions of elements are different from those in the amorphous metal oxide semiconductor layer 220 and a part in which proportions of elements are the same as those in the amorphous metal oxide semiconductor layer 220, and may also include some metal oxide semiconductor crystals.

It should be noted that the indium oxide crystallization layer 222 has a desirable acid-resistance characteristic. For example, the indium oxide crystallization layer 222 can resist an aluminum acid etchant obtained by mixing nitric acid, phosphoric acid, and acetic acid, and also has high stability and high conductivity, and is transparent. In addition, electron mobility inside the indium oxide crystallization layer 222 is similar to that inside the amorphous metal oxide semiconductor layer 220. Therefore, the indium oxide crystallization layer 222 is suitable for use as an active layer of a TFT, and applicability is significantly wide.

In an embodiment, a material of the amorphous metal oxide semiconductor layer 220 is selected to be indium gallium zinc oxide (InGaZnO$_4$), where a mole ratio of indium:gallium:zinc:oxygen is 1:1:1:4. The amorphous metal oxide semiconductor layer 220 is treated with oxygen, so as to change a part of a surface of the amorphous metal oxide semiconductor layer 220 into the indium oxide crystallization layer 222, and form the metal oxide semiconductor layer 224. In the metal oxide semiconductor layer 224, because a part of indium is removed, in the metal oxide semiconductor layer 224 close to the indium oxide crystallization layer 222, a metal oxide semiconductor in which proportions of a plurality of elements are different from those of indium gallium zinc oxide (InGaZnO$_4$) is generated, and an indium gallium zinc oxide (In$_2$Ga$_2$ZnO$_7$) crystal is generated, where in some embodiments, a mole ratio of indium:gallium:zinc:oxygen is 2:2:1:7.

In an embodiment, a radio-frequency power source is further included, and is used to perform oxidization treatment on the amorphous metal oxide semiconductor layer 220. Moreover, when the amorphous metal oxide semiconductor layer 220 is being treated with oxygen, an output power of the radio-frequency power source is 0. In an embodiment, when the amorphous metal oxide semiconductor layer 220 is being treated with oxygen, an output power of the radio-frequency power source is greater than 0. In other words, in the present invention, regardless of whether the radio-frequency power source exists, as long as the amorphous metal oxide semiconductor layer 220 is treated with oxygen within a pressure range and a temperature range of the present invention, a part of the amorphous metal oxide semiconductor layer 220 can be changed into the indium oxide crystallization layer 222. The output power of the radio-frequency power source may be adjusted depending on the pressure range and the temperature range.

In an embodiment, according to a different design requirement, a time length of treating the amorphous metal oxide semiconductor layer 220 with oxygen may be adjusted to control a thickness of the indium oxide crystallization layer 222.

In the operation 130, the indium oxide crystallization layer 222 is heated. In an embodiment, the heating the indium oxide crystallization layer 222 is performed at a temperature of about 200° C. to about 800° C., or is further adjusted to be performed at about 250° C. to about 300° C., or is further adjusted to be performed at about 370° C. After thermal treatment, crystallinity of the indium oxide crystallization layer 222 is improved. Therefore, in an embodiment, the temperature at which the indium oxide crystallization layer 222 is heated is higher than the temperature at which the amorphous metal oxide semiconductor layer 220 is treated with oxygen. In an embodiment, the operation 130 is performed in a vacuum environment; however, the operation 130 may also be performed in a non-vacuum environment.

In an embodiment, the operation 120 is performed in a reaction chamber of a CVD device, and the operation 130 is performed in a heating chamber of the CVD device.

In an embodiment, the operation 120 is performed. Oxygen with a flow rate being 3500 sccm is introduced in the reaction chamber of the CVD device, and a radio-frequency power source is disposed, where an output power of the radio-frequency power source is 1250 w. The amorphous metal oxide semiconductor layer 220 is treated with oxygen in a condition in which a temperature is 430° C. and a pressure is 850 mtorr, and a time of the treatment is about 60 seconds. The operation 130 is then performed. The indium oxide crystallization layer is heated in the heating chamber of the CVD device, where a temperature is 500° C., and a time of the treatment is 1 hour. A capability of acid resistance of the semiconductor structure 200 against an aluminum acid is further tested. An etching rate of the semiconductor structure 200 in etching using an aluminum acid is 16.5 angstrom/second, which is less than an etching rate of the amorphous metal oxide semiconductor layer 220 without being treated with oxygen. It is proved that by means of the method for crystallizing a metal oxide semiconductor layer of the present invention, an amorphous metal oxide semiconductor layer can have a characteristic of resistance against corrosion of aluminum acid.

Figure 3B:
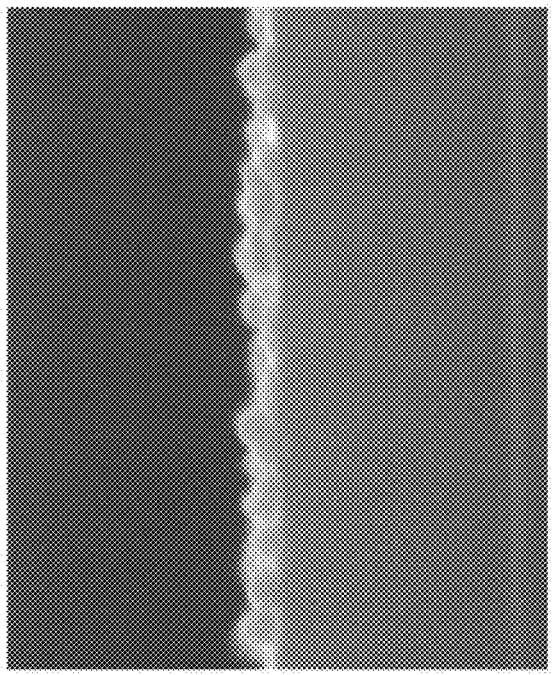
FIG. 3B is a SEM image of a side-view section of the semiconductor structure 200.
Figure 3A:
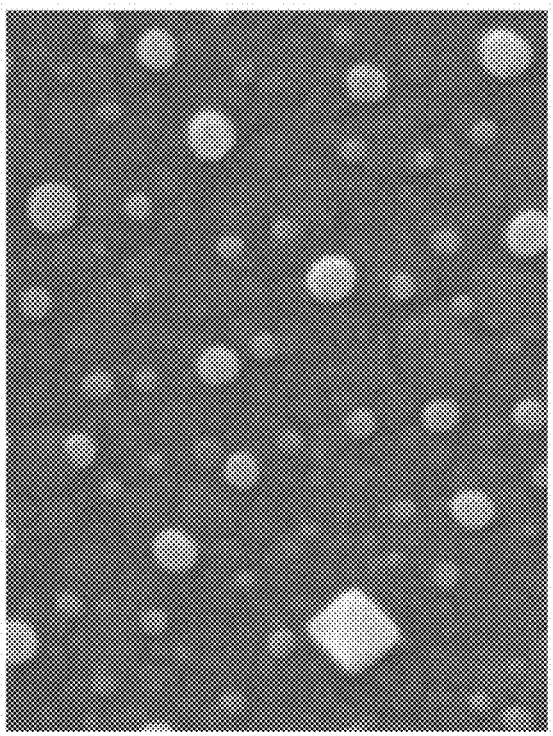
FIG. 3A is a scanning electron microscope (SEM) image of a top view of a semiconductor structure 200.

Referring to FIG. 3A, FIG. 3A is a top scanning electron microscope (SEM) image of the semiconductor structure 200. An outer form of indium oxide crystals can be seen from particles having relatively light colors and varied sizes. The indium oxide crystallization layer 222 is formed of these indium oxide crystals, and has a rough and uneven surface. Referring to FIG. 3B, FIG. 3B is a SEM image of a side-view section of the semiconductor structure 200, where a part of a relatively light color is a side view of the indium oxide crystallization layer 222. Similarly, it can be seen that the indium oxide crystallization layer 222 has an uneven surface.

Figure 5:
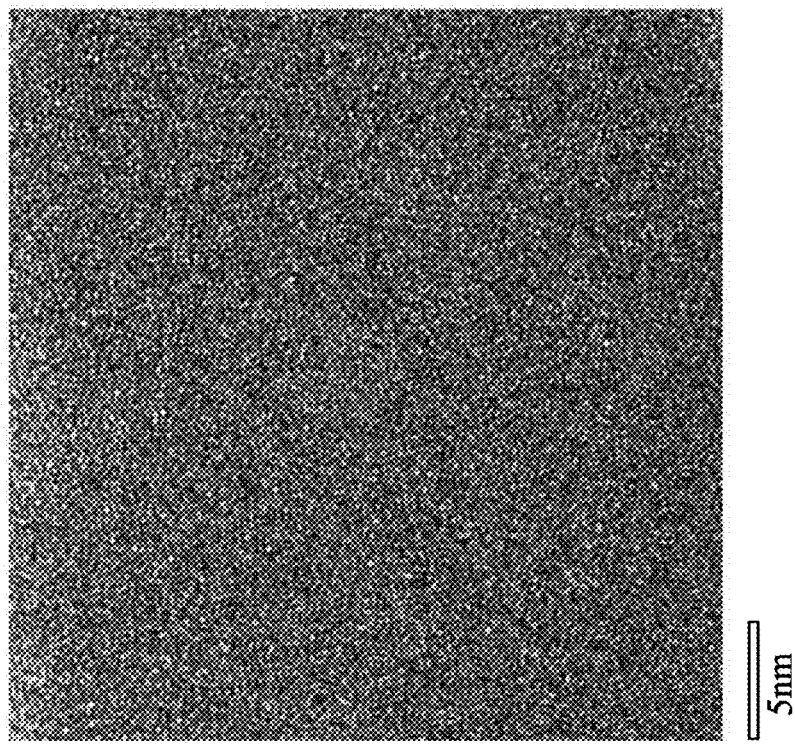
FIG. 5 is an HRTEM image of a metal oxide semiconductor layer.
Figure 4:
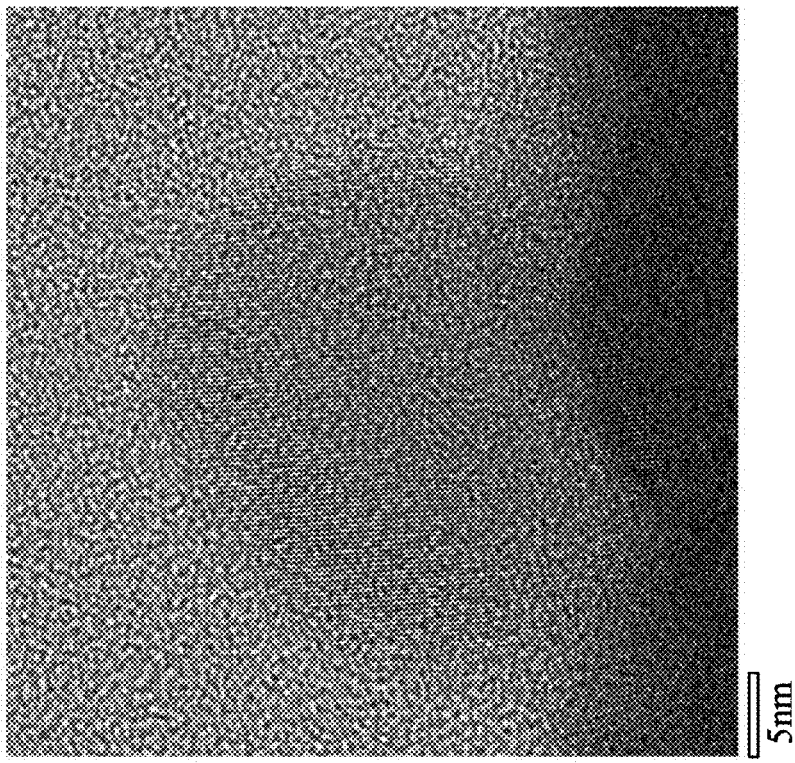
FIG. 4 is a high-resolution transmission electron microscope (HRTEM) image of an indium oxide crystallization layer.

Referring to FIG. 4, FIG. 4 is an high-resolution transmission electron microscopy (HRTEM) image of the indium oxide crystallization layer 222. An orderly arrangement of internal atoms can be seen. Referring to FIG. 5, FIG. 5 is an HRTEM image of the metal oxide semiconductor layer 224. Herein, the metal oxide semiconductor layer 224 relatively away from the indium oxide crystallization layer 222 is observed. It can be seen that internal atoms are arranged in a disorderly manner. No crystal is generated, and an amorphous form which is the same as that of the amorphous metal oxide semiconductor layer 220 is maintained.

Figure 6:
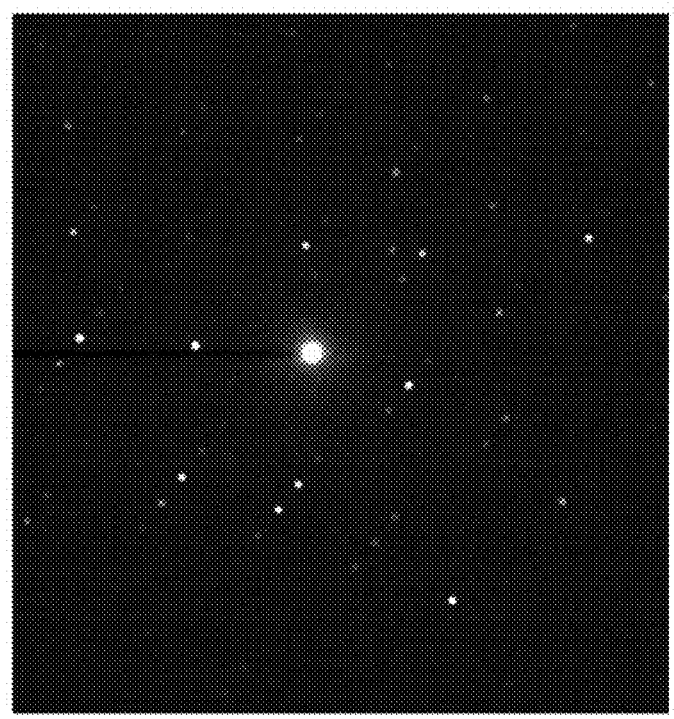
FIG. 6 is a nano-beam electron diffraction (NBED) image of an indium oxide crystallization layer.
Figure 7:
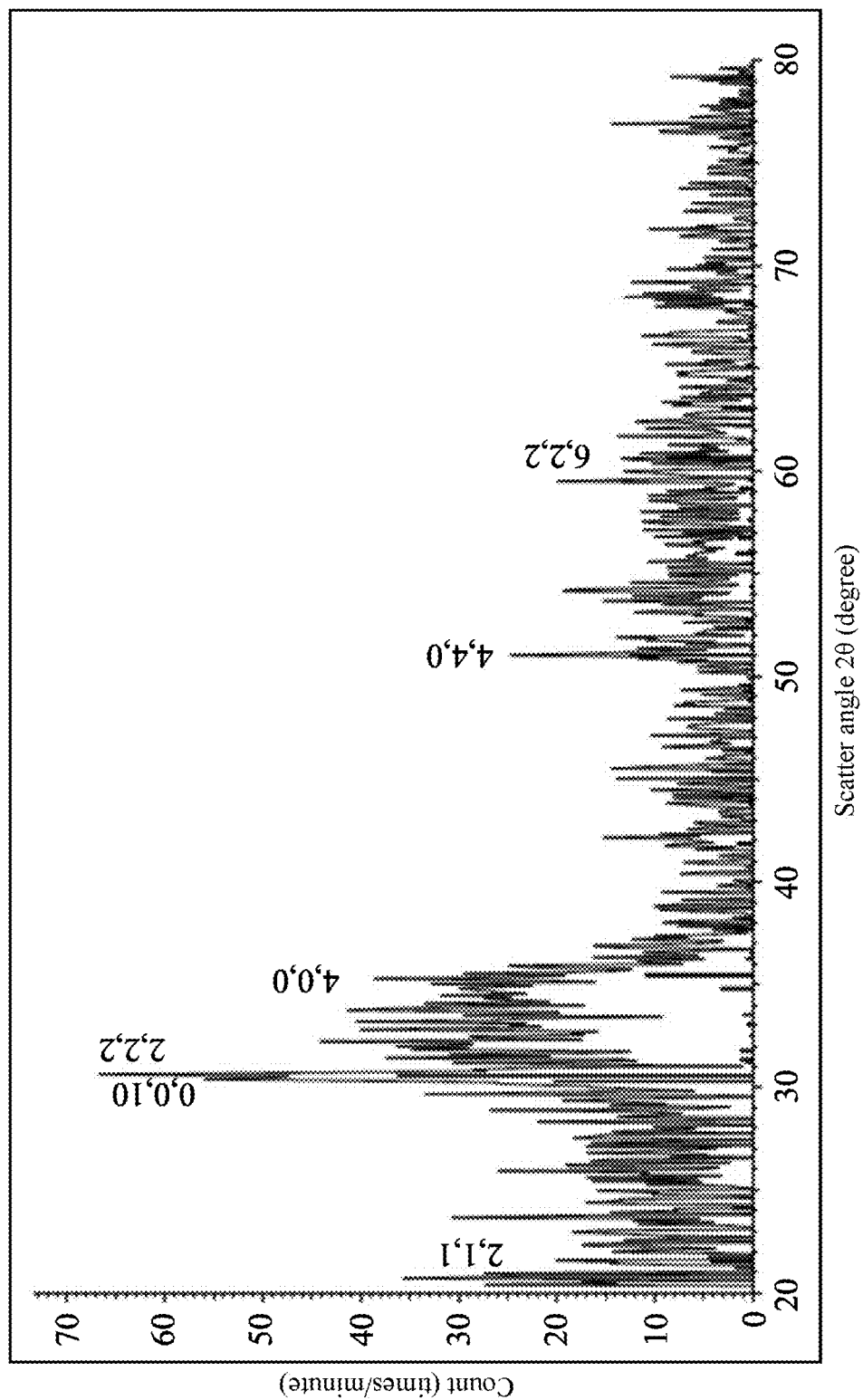
FIG. 7 is an X-ray diffraction (XRD) spectrum of the semiconductor structure 200.

Referring to FIG. 6, FIG. 6 is a nano-beam electron diffraction (NBED) image of the indium oxide crystallization layer 222. It can be seen from obvious diffraction points that an indium oxide crystal exists. Referring to FIG. 7, in an X-ray diffraction (XRD) spectrum of the semiconductor structure 200, a horizontal axis is a scatter angle 2θ with a unit of degree, and a vertical axis is a count with a unit of times/minute. When a signal (2, 2, 2) appears, it represents that an indium oxide (In$_2$O$_3$) crystal exists. When a signal (0, 0, 10) appears, it represents that an indium gallium zinc oxide (In$_2$Ga$_2$ZnO$_7$) crystal exists. As seen from FIG. 7, the signal (2, 2, 2) is relatively strong, and it can be known that the content of the indium oxide crystal inside the semiconductor structure 200 is relatively higher.

According to the foregoing method for crystallizing a metal oxide semiconductor layer, after treatment with oxygen, a part of a surface of an amorphous metal oxide semiconductor layer is changed into an indium oxide crystallization layer having a characteristic of resistance against aluminum acid etching solution. By using an advantage of the crystallization method, the method could be applied to fabrication of a semiconductor structure to provide a new semiconductor structure. FIG. 8A to FIG. 8C are schematic sectional views of a semiconductor structure in stages of a process according to an embodiment of the present invention.

Referring to FIG. 8A, a gate 830 and a first capacitor electrode 840 are formed on a substrate 810, and a gate insulation layer 820 is formed to cover the gate 830 and the first capacitor electrode 840. Next, an amorphous metal oxide semiconductor layer 852 and an amorphous metal oxide semiconductor layer 856 are formed on the gate insulation layer 820, and the amorphous metal oxide semiconductor layer 852 is thicker than the amorphous metal oxide semiconductor layer 856. In certain embodiments, the amorphous metal oxide semiconductor layer 852 and the amorphous metal oxide semiconductor layer 856 may be fabricated through the use of a half-tone mask.

In an embodiment, the amorphous metal oxide semiconductor layer 852 and the amorphous metal oxide semiconductor layer 856 include indium. In an embodiment, the amorphous metal oxide semiconductor layer 852 and the amorphous metal oxide semiconductor layer 856 include indium gallium zinc oxide, indium tin zinc oxide, hafnium indium zinc oxide or indium zinc oxide.

Next, the amorphous metal oxide semiconductor layer 852 and the amorphous metal oxide semiconductor layer 856 are treated with oxygen at a pressure of about 550 mtorr to about 5000 mtorr and at a temperature of about 200° C. to about 750° C., as shown in FIG. 8B, so as to change a part of a surface of the amorphous metal oxide semiconductor layer 852 into a first indium oxide crystallization layer 853, and form a first metal oxide semiconductor layer 854. Moreover, a part of a surface of the amorphous metal oxide semiconductor layer 856 is changed into a second indium oxide crystallization layer 857, and a second metal oxide semiconductor layer 858 is formed.

It should be noted that, a temperature condition used in the present invention is about 200° C. to about 750° C., which is lower than a melting point of the substrate 810. When the substrate 810 is a glass substrate, at this temperature, the substrate 810 does not melt or is not affected. However, an effect of generating the first indium oxide crystallization layer 853 and the second indium oxide crystallization layer 857 in the amorphous metal oxide semiconductor layer 852 and the amorphous metal oxide semiconductor layer 856 may still be achieved. Therefore, the crystallization method of an embodiment of the present invention can meet a fabrication requirement when the substrate 810 is a glass substrate.

In an embodiment, the first metal oxide semiconductor layer 854 and the second metal oxide semiconductor layer 858 include indium. In an embodiment, the first metal oxide semiconductor layer 854 and the second metal oxide semiconductor layer 858 include indium gallium zinc oxide, indium tin zinc oxide, hafnium indium zinc oxide or indium zinc oxide. In addition, referring to the embodiments in FIG. 1 and FIG. 2A and FIG. 2B, the first metal oxide semiconductor layer 854 and the second metal oxide semiconductor layer 858 include an indium gallium zinc oxide ($In_2Ga_2ZnO_7$) crystal.

In an embodiment, because the amorphous metal oxide semiconductor layer 852 is thicker than the amorphous metal oxide semiconductor layer 856, after the treatment with oxygen, the first metal oxide semiconductor layer 854 is thicker than the second metal oxide semiconductor layer 858, and the first metal oxide semiconductor layer 854 keeps more amorphous metal oxide semiconductor that is not affected by the treatment with oxygen. The amorphous metal oxide semiconductor has desirable evenness, and is therefore more suitable for use as an active layer of a TFT.

The second indium oxide crystallization layer 857 has desirable conductivity, and therefore may be used as a second capacitor electrode, and form a storage capacitor with the first capacitor electrode 840.

Next, a metal layer is formed to cover the first indium oxide crystallization layer 853, and the metal layer is patterned to form a source 862 and a drain 864 shown in FIG. 8C, so as to form a back channel etching (BCE) type TFT. It should be noted that, because the first indium oxide crystallization layer 853 has a desirable acid-resistance characteristic, when an etching process is performed on the metal layer, the first indium oxide crystallization layer 853 can protect the first metal oxide semiconductor layer 854 below, to avoid corrosion by an acidic etchant (for example, an aluminum acid etchant), so as to maintain a structure and a property of the first metal oxide semiconductor layer 854 as the active layer, thereby improving a yield of eventually formed TFTs.

In an embodiment, a material of the metal layer is molybdenum (Mo), aluminum (Al), copper (Cu), silver (Ag), titanium (Ti), tantalum (Ta), tin (Sn), nickel (Ni), gold (Au), tungsten (W), chromium (Cr), platinum (Pt), an alloy or a combination thereof. In an embodiment, the metal layer is a single metal layer or is a metal stacked layer.

In an embodiment, the metal layer is a metal stacked layer of molybdenum/aluminum/molybdenum, and has a relatively low resistance value, and a wet etching process may be performed to pattern the metal layer to form a source and a drain. For example, an aluminum acid etchant may be used to pattern the metal layer.

Next, a protection layer 870 is formed on the gate insulation layer 820, the first indium oxide crystallization layer 853, the second indium oxide crystallization layer 857, the source 862, and the drain 864. The protection layer 870 has some openings to expose the drain 864 and the second indium oxide crystallization layer 857, and a conductive layer 880 is formed on the protection layer 870, and is in contact with the drain 864 and the second indium oxide crystallization layer 857 through these openings, so as to form a semiconductor structure 800.

According to an embodiment of the present invention, the semiconductor structure 800 includes the substrate 810, the gate insulation layer 820, the gate 830, the first capacitor electrode 840, the first indium oxide crystallization layer 853, the first metal oxide semiconductor layer 854, the second indium oxide crystallization layer 857, the second metal oxide semiconductor layer 858, the source 862, the drain 864, the protection layer 870, and the conductive layer 880. The gate 830 and the first capacitor electrode 840 are configured on the substrate 810, the gate insulation layer 820 is located on the gate 830 and the first capacitor electrode 840, the first metal oxide semiconductor layer 854 and the second metal oxide semiconductor layer 858 are configured on the gate insulation layer 820, the first indium oxide crystallization layer 853 is in contact with an outside surface of the first metal oxide semiconductor layer 854, the source 862 and the drain 864 are configured on the first indium oxide crystallization layer 853, the second indium oxide crystallization layer 857 is in contact with an outside surface of the second metal oxide semiconductor layer 858, and is used as a second capacitor electrode, and the first capacitor electrode 840 forms a storage capacitor.

Figure 9A:
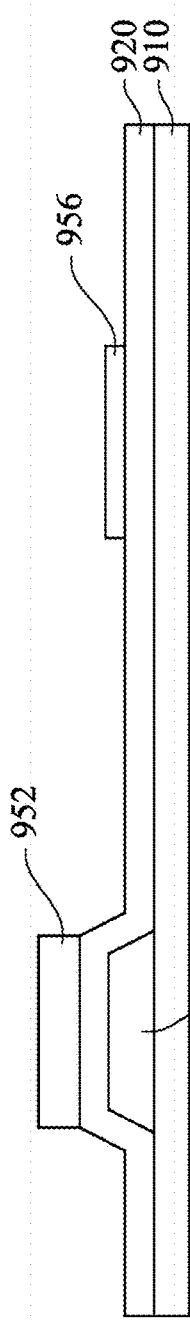
FIG. 9A to FIG. 9C are schematic sectional views of a semiconductor structure in stages of a process according to an embodiment of the present invention.
Figure 9B:
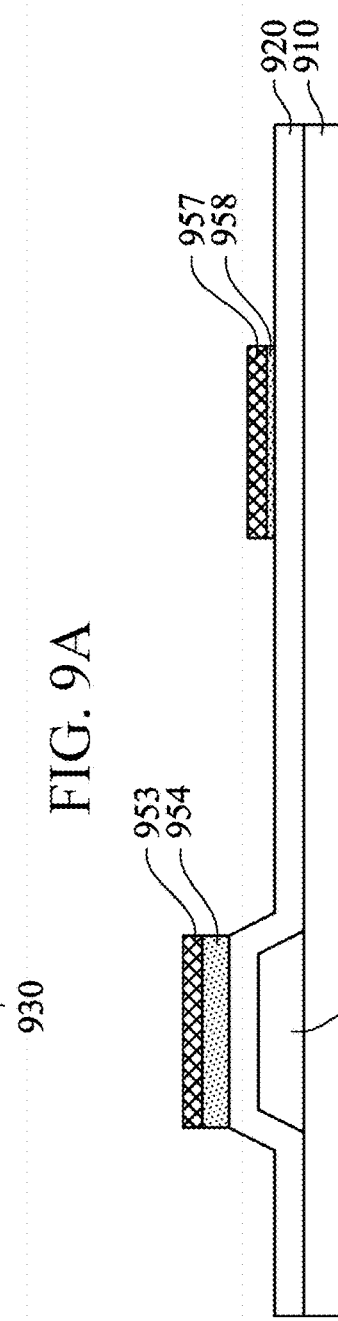
Figure 9C:
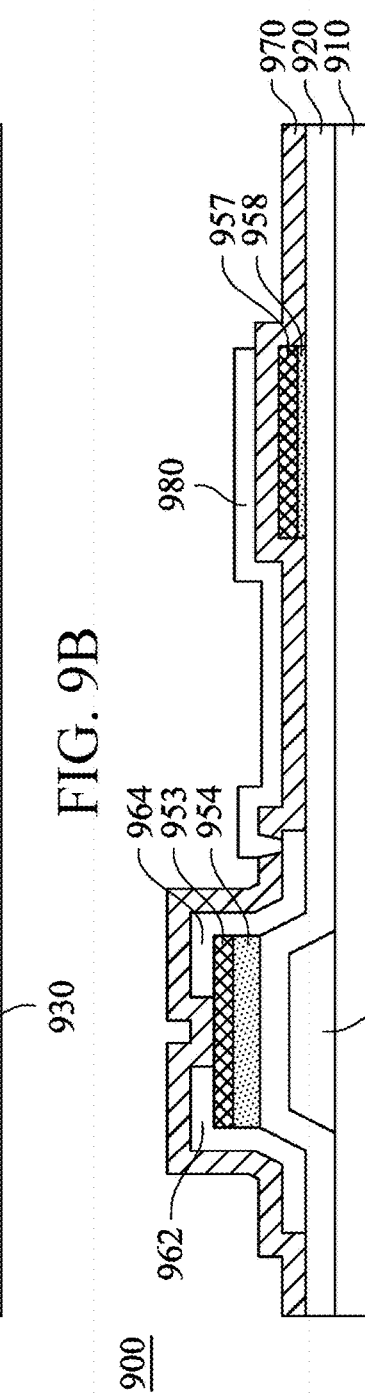

Next, an embodiment of the present invention further provides another new semiconductor structure. FIG. 9A to FIG. 9C are schematic sectional views of a semiconductor structure in stages of a process according to an embodiment of the present invention. Referring to FIG. 9A, a gate 930 is formed on a substrate 910, and the gate insulation layer 920 is formed to cover the gate 930. Next, an amorphous metal oxide semiconductor layer 952 and an amorphous metal oxide semiconductor layer 956 are formed on the gate insulation layer 920, and the amorphous metal oxide semiconductor layer 952 is thicker than the amorphous metal oxide semiconductor layer 956.

Referring to an embodiment of treating the amorphous metal oxide semiconductor layer 852 and the amorphous metal oxide semiconductor layer 856 with oxygen in FIG. 8A and FIG. 8B, a same experimental condition is also used to treat the amorphous metal oxide semiconductor layer 952 and the amorphous metal oxide semiconductor layer 956, to form a first indium oxide crystallization layer 953, a first metal oxide semiconductor layer 954, a second indium oxide crystallization layer 957, and a second metal oxide semiconductor layer 958 shown in FIG. 9B. The second indium oxide crystallization layer 957 has desirable conductivity, and therefore may be used as a first capacitor electrode, and form a storage capacitor with an element in subsequent treatment.

Next, a metal layer is formed to cover the first indium oxide crystallization layer 953, and the metal layer is patterned to form a source 962 and a drain 964 shown in FIG. 9C, so as to form a BCE type TFT. It should be noted that, because the first indium oxide crystallization layer 953 has a desirable acid-resistance characteristic, when an etching process is performed on the metal layer, the first indium oxide crystallization layer 953 can protect the first metal oxide semiconductor layer 954 below, to avoid corrosion by an acidic etchant (for example, an aluminum acid etchant), so as to maintain a structure and a property of the first metal oxide semiconductor layer 954 as the active layer, thereby improving a yield of eventually formed TFTs.

Next, a protection layer 970 is formed on the gate insulation layer 920, the first indium oxide crystallization layer 953, the second indium oxide crystallization layer 957, the source 962, and the drain 964. The protection layer 970 has an opening to expose the drain 964, and a second capacitor electrode 980 is formed on the protection layer 970, and is in contact with the drain 964 through this opening. The second capacitor electrode 980 extends along an upper surface of the protection layer 970 to above the second indium oxide crystallization layer 957, and form a storage capacitor with the second indium oxide crystallization layer 957, so as to form a semiconductor structure 900. Reference may be made to the embodiment in FIG. 8A to FIG. 8C for materials and components of elements in the semiconductor structure 900, which are no longer elaborated herein.

According to an embodiment of the present invention, the semiconductor structure 900 includes the substrate 910, the gate insulation layer 920, the gate 930, the first indium oxide crystallization layer 953, the first metal oxide semiconductor layer 954, the second indium oxide crystallization layer 957, the second metal oxide semiconductor layer 958, the source 962, the drain 964, the protection layer 970, and the second capacitor electrode 980. The gate 930 is configured on the substrate 910, the gate insulation layer 920 is located on the gate 930, the first metal oxide semiconductor layer 954 and the second metal oxide semiconductor layer 958 are configured on the gate insulation layer 920, the first indium oxide crystallization layer 953 is in contact with an outside surface of the first metal oxide semiconductor layer 954, the source 962 and the drain 964 are configured on the first indium oxide crystallization layer 953, the second indium oxide crystallization layer 957 is in contact with an outside surface of the second metal oxide semiconductor layer 958, and is used as a first capacitor electrode, the protection layer 970 is located on the second indium oxide crystallization layer 957, and the second capacitor electrode 980 is configured on the protection layer 970, and forms a storage capacitor with the second indium oxide crystallization layer 957. In an embodiment, a material of the second capacitor electrode 980 is transparent indium tin oxide (ITO), so that the second capacitor electrode 980 and the transparent second indium oxide crystallization layer 957 can form a transparent type storage capacitor having a high transmittance, thereby increasing an aperture ratio of the semiconductor structure 900.

Figure 10:
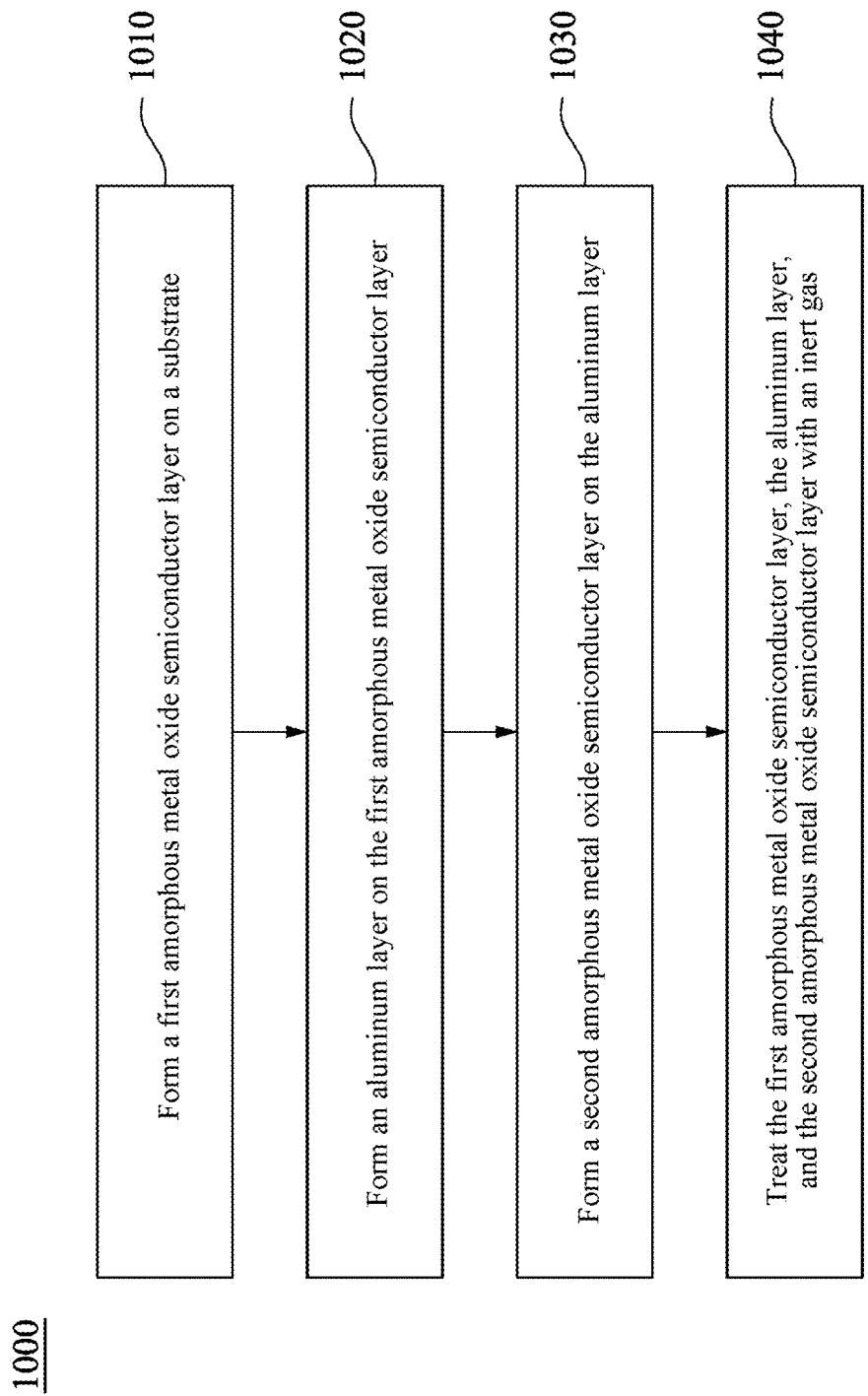
FIG. 10 shows a method for crystallizing a metal oxide semiconductor layer according to an embodiment of the present invention.
Figure 11A:
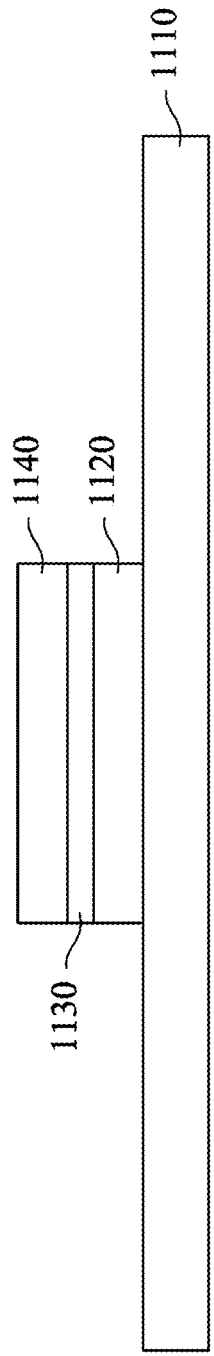
FIG. 11A and FIG. 11B are schematic sectional views of a semiconductor structure in stages of a process according to an embodiment of the present invention.
Figure 11B:
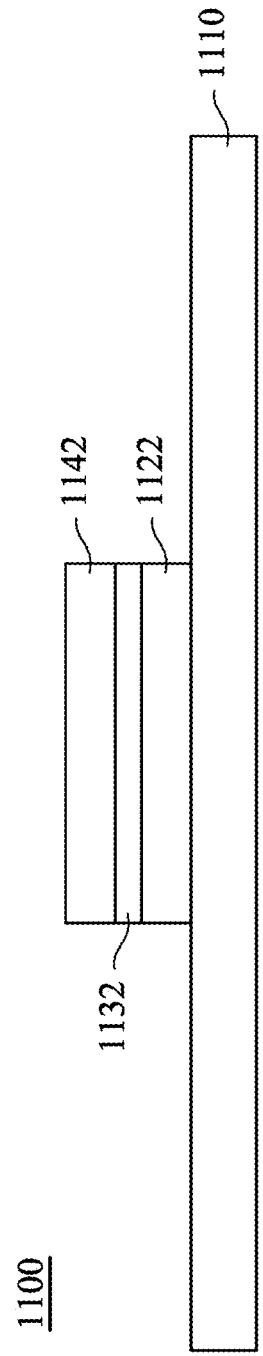

One embodiment of the present invention further provides another method for crystallizing a metal oxide semiconductor layer. Referring to FIG. 10 and FIG. 11A and FIG. 11B. FIG. 10 shows a method 1000 for crystallizing a metal oxide semiconductor layer according to an embodiment of the present invention. A crystallization method 1000 includes an operation 1010, an operation 1020, an operation 1030, and an operation 1040. FIG. 11A and FIG. 11B are schematic sectional views of a semiconductor structure 1100 in stages of a process according to an embodiment of the present invention. Although a series of operations or steps are used below to describe the method disclosed herein, an order of these operations or steps should not be construed as a limitation to the present invention. For example, some operations or steps may be performed in a different order and/or other steps may be performed at the same time. In addition, all shown operations, steps and/or features are not required to be executed to implement an embodiment of the present invention. In addition, each operation or step described herein may include a plurality of sub-steps or actions.

In the operation 1010, as shown in FIG. 11A, a first amorphous metal oxide semiconductor layer 1120 is formed on a substrate 1110. In an embodiment, the first amorphous metal oxide semiconductor layer 1120 includes indium gallium zinc oxide, indium tin zinc oxide, hafnium indium zinc oxide or indium zinc oxide. In the operation 1020, as shown in FIG. 11A, an aluminum layer 1130 is formed on the first amorphous metal oxide semiconductor layer 1120. In an embodiment, a thickness of the aluminum layer 1130 is 50 angstrom (Å) to 200 Å. In the operation 1030, as shown in FIG. 11A, a second amorphous metal oxide semiconductor layer 1140 is formed on the aluminum layer 1130. In an embodiment, the second amorphous metal oxide semiconductor layer 1140 includes indium gallium zinc oxide, indium tin zinc oxide, hafnium indium zinc oxide or indium zinc oxide.

Next, the first amorphous metal oxide semiconductor layer 1120, the aluminum layer 1130, and the second amorphous metal oxide semiconductor layer 1140 are treated with an inert gas at a temperature of about 350° C. to about 650° C. In an embodiment, the inert gas includes nitrogen gas ($N_2$), helium gas (He), neon gas (Ne), argon gas (Ar), krypton gas (Kr), xenon gas (Xe), radon gas (Rn) or a combination thereof.

After the treatment with the inert gas, the first amorphous metal oxide semiconductor layer 1120, the aluminum layer 1130, and the second amorphous metal oxide semiconductor layer 1140 are respectively changed into a first crystallized metal oxide semiconductor layer 1122, an aluminum oxide ($Al_2O_3$) layer 1132, and a second crystallized metal oxide semiconductor layer 1142 shown in FIG. 11B, to form the semiconductor structure 1100. The reason is that the aluminum layer 1130 reacts with oxygen. When a high-temperature environment is provided and the inert gas is introduced, the aluminum layer 1130 captures oxygen in the first amorphous metal oxide semiconductor layer 1120 and the second amorphous metal oxide semiconductor layer 1140, and reacts with the oxygen to form the aluminum oxide layer 1132, resulting in that the content of oxygen in the first amorphous metal oxide semiconductor layer 1120 and the second amorphous metal oxide semiconductor layer 1140 is reduced, and elements therein are rearranged, to form the first crystallized metal oxide semiconductor layer 1122 and the second crystallized metal oxide semiconductor layer 1142.

In an embodiment, a material of the first amorphous metal oxide semiconductor layer 1120 and the second amorphous metal oxide semiconductor layer 1140 is selected to be indium gallium zinc oxide (InGaZnO$_4$), where a mole ratio of indium:gallium:zinc:oxygen is 1:1:1:4. After the treatment with the inert gas, it may be known from analysis of an XRD spectrum of the semiconductor structure 1100 that the first crystallized metal oxide semiconductor layer 1122 and the second crystallized metal oxide semiconductor layer 1142 both contain at least two crystals: an indium gallium zinc oxide (InGaZnO$_4$) crystal and an indium oxide (In$_2$O$_3$) crystal.

Moreover, it may be seen from an HRTEM image of the second crystallized metal oxide semiconductor layer 1142 that atoms in the entire layer are arranged in an orderly manner. As seen from an NBED image of the second crystallized metal oxide semiconductor layer 1142, images of an upper layer, a middle layer, and a lower layer all have obvious diffraction points. It can be known according to the foregoing experimental result that after the treatment with the inert gas, the second crystallized metal oxide semiconductor layer 1142 is holocrystalline. In addition, if the first crystallized metal oxide semiconductor layer 1122 is analyzed in the same way, a same experimental result can be observed, and the first crystallized metal oxide semiconductor layer 1122 is also holocrystalline.

Next, a capability of acid resistance of the semiconductor structure 1100 against an aluminum acid is further tested. An etching rate of the second crystallized metal oxide semiconductor layer 1142 in etching using an aluminum acid is 2.8 angstrom/second, which is less than an etching rate of the second amorphous metal oxide semiconductor layer 1140 without being treated with the inert gas. It is proved that by means of the method for crystallizing a metal oxide semiconductor layer of the present invention, an entire amorphous metal oxide semiconductor layer can be crystallized, and an acid-resistance characteristic is achieved.

By using an advantage of the crystallization method, the present invention is applied to fabrication of a BCE type semiconductor structure, but is not limited thereto, and can also be applied to another types of semiconductor devices. FIG. 12A to FIG. 12C are schematic sectional views of a semiconductor structure 1200 in stages of a process according to an embodiment of the present invention.

Referring to FIG. 12A, a gate 1212 is formed on a substrate 1210, and a gate insulation layer 1214 is formed to cover the gate 1212. Next, referring to the operations 1010 to 1030, a first amorphous metal oxide semiconductor layer 1220, an aluminum layer 1230, and a second amorphous metal oxide semiconductor layer 1240 are sequentially formed on the gate insulation layer 1214. The aluminum layer 1230 covers the first amorphous metal oxide semiconductor layer 1220 and the gate insulation layer 1214. In another embodiment, the aluminum layer exists between only the first amorphous metal oxide semiconductor layer 1220 and the second amorphous metal oxide semiconductor layer 1240.

Next, the operation 1040 is performed. The first amorphous metal oxide semiconductor layer 1220, the aluminum layer 1230, and the second amorphous metal oxide semiconductor layer 1240 is treated with an inert gas at a temperature of about 350° C. to about 650° C. When a high-temperature environment is provided and the inert gas is introduced, the aluminum layer sandwiched between the first amorphous metal oxide semiconductor layer 1220 and the second amorphous metal oxide semiconductor layer 1240 captures oxygen in the first amorphous metal oxide semiconductor layer 1220 and the second amorphous metal oxide semiconductor layer 1240, so as to form a first crystallized metal oxide semiconductor layer 1222, an aluminum oxide layer 1232, and a second crystallized metal oxide semiconductor layer 1242 shown in FIG. 12B. It should be noted that, the aluminum layer 1230 that is not sandwiched between the first amorphous metal oxide semiconductor layer 1220 and the second amorphous metal oxide semiconductor layer 1240 is not affected.

Next, the aluminum layer 1230 shown in FIG. 12B is oxidized into an aluminum oxide layer 1234 shown in FIG. 12C. In an embodiment, the oxidization is performed by using an aluminum oxidization method. For example, the aluminum layer 1230 is treated with oxygen or clean dry air (CDA), to form the aluminum oxide layer 1234. The first crystallized metal oxide semiconductor layer 1222 and the second crystallized metal oxide semiconductor layer 1242 are changed into a crystallized state, and are therefore not affected in the process of forming the aluminum oxide layer 1234.

It should be noted that, the aluminum oxide layer 1234 has a characteristic of avoiding vapor permeation. Therefore, if another semiconductor element exists below the aluminum oxide layer 1234, the aluminum oxide layer 1234 can be used as a desirable protection layer to avoid vapor permeation that affects a property of the semiconductor element. In the process of forming the aluminum layer 1230 in FIG. 12A, a common etching process may be used to make the aluminum layer 1230 have different thicknesses at different positions. For example, the aluminum layer 1230 sandwiched between the first amorphous metal oxide semiconductor layer 1220 and the second amorphous metal oxide semiconductor layer 1240 has a relatively small thickness, whereas the rest part of the aluminum layer 1230 has a relatively large thickness, so that the aluminum oxide layer 1234 is also relatively thick accordingly, and can be used as a desirable protection layer. In an embodiment, the aluminum layer 1230 sandwiched between the first amorphous metal oxide semiconductor layer 1220 and the second amorphous metal oxide semiconductor layer 1240 has a relatively large thickness, and the rest part of the aluminum layer 1230 has a relatively thin thickness. Therefore, according to a different design requirement, the relatively thick aluminum oxide layer 1234 may be formed on a semiconductor element that needs to be protected, or the aluminum layer may be formed on only a partial area. In an embodiment, the aluminum oxide layer 1234 may be formed on a flexible substrate for protection. For example, the aluminum oxide layer 1234 with a specific pattern may be formed on a integrated circuit (IC) bonding area to protect the backplane. Next, a source 1262 and a drain 1264 are formed on the second crystallized metal oxide semiconductor layer 1242, and a protection layer 1270 is then formed to cover the source 1262 and the drain 1264. The protection layer 1270 has some openings to expose the drain 1264, and a conductive layer 1280 is formed on the protection layer 1270, and is in contact with the drain 1264 through these openings, so as to form the semiconductor structure 1200.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A method for crystallizing a metal oxide semiconductor layer, comprising:
    forming an amorphous metal oxide semiconductor layer on a substrate, the amorphous metal oxide semiconductor layer comprising indium gallium zinc oxide, where a mole ratio of indium:gallium:zinc:oxygen is 1:1:1:4;
    treating the amorphous metal oxide semiconductor layer with oxygen at a pressure of about 550 mtorr to about 5000 mtorr at a temperature of about 200° C. to about 750° C., and changing a part of the amorphous metal oxide semiconductor layer into an indium oxide crystallization layer; and
    providing a radio-frequency power source, wherein when the amorphous metal oxide semiconductor layer is being treated with oxygen, the radio-frequency power source is provided with an output power;
    wherein the indium oxide crystallization layer has a desirable acid-resistance characteristic, such that the indium oxide crystallization layer can resist an aluminum acid etchant obtained by mixing nitric acid, phosphoric acid, and acetic acid.

2. The method according to claim 1, further comprising: heating the indium oxide crystallization layer.

3. The method according to claim 2, wherein the heating the indium oxide crystallization layer is performed at a temperature of about 200° C. to about 800° C.

4. The method according to claim 1, wherein when the amorphous metal oxide semiconductor layer is being treated with oxygen, the output power of the radio-frequency power source is greater than 0.

* * * * *